United States Patent
Dickens et al.

(10) Patent No.: US 6,415,244 B1
(45) Date of Patent: Jul. 2, 2002

(54) POWER MONITORING SYSTEM AND METHOD

(75) Inventors: Richard T. Dickens, West Des Moines; Robert E. Havens, Eldridge; James E. Siem, Davenport, all of IA (US)

(73) Assignee: Mehta Tech, Inc., Eldridge, IA (US)

( * ) Notice: Subject to any disclaimer, the term of this patent is extended or adjusted under 35 U.S.C. 154(b) by 0 days.

(21) Appl. No.: 09/282,834

(22) Filed: Mar. 31, 1999

Related U.S. Application Data

(60) Provisional application No. 60/080,054, filed on Mar. 31, 1998.

(51) Int. Cl.$^7$ .......................... G01R 31/00; G06F 15/00
(52) U.S. Cl. .......................... 702/187; 702/58; 702/59; 324/512
(58) Field of Search ................................ 702/187–188, 702/57–59, 79–80, 63–64, 70–71; 324/500, 512, 520–522; 341/126, 132; 361/79–80

(56) References Cited

U.S. PATENT DOCUMENTS

| | | | |
|---|---|---|---|
| 3,921,070 A | 11/1975 | Ringstad et al. | 324/142 |
| 4,156,280 A | 5/1979 | Griess | 364/481 |
| 4,161,027 A | 7/1979 | Russell | 364/492 |
| 4,224,672 A | 9/1980 | Leleu et al. | 346/33 |
| 4,333,119 A | 6/1982 | Schoenmeyr | 361/76 |
| 4,455,612 A | 6/1984 | Girgis et al. | 364/483 |
| 4,484,290 A | 11/1984 | Bagnall et al. | 364/483 |
| 4,499,417 A * | 2/1985 | Wright et al. | 324/522 |
| 4,535,409 A | 8/1985 | Jindrick et al. | 364/481 |
| 4,553,223 A * | 11/1985 | Bouhelier et al. | 324/111 |
| 4,589,074 A | 5/1986 | Thomas et al. | 364/483 |
| 4,672,555 A | 6/1987 | Hart et al. | 364/483 |
| 4,680,706 A | 7/1987 | Bray | 364/492 |
| 4,766,549 A | 8/1988 | Schweitzer, III et al. | 364/481 |
| 4,797,805 A | 1/1989 | Nimmersjo | 364/481 |
| 4,812,995 A | 3/1989 | Girgis et al. | 364/481 |
| 4,845,594 A | 7/1989 | Wilkerson | 361/71 |
| 4,979,122 A | 12/1990 | Davis et al. | 364/483 |
| 5,027,297 A * | 6/1991 | Garitty et al. | 702/187 |
| 5,072,403 A | 12/1991 | Johns | 364/492 |
| 5,181,026 A | 1/1993 | Granville | 340/870.28 |
| 5,216,621 A * | 6/1993 | Dickens | 702/58 |
| 5,224,054 A | 6/1993 | Wallis | 364/483 |
| 5,233,538 A | 8/1993 | Wallis | 364/483 |
| 5,426,360 A | 6/1995 | Maraio et al. | 324/126 |
| 5,428,549 A | 6/1995 | Chen | 364/483 |
| 5,455,776 A | 10/1995 | Novosel | 364/492 |
| 5,469,365 A | 11/1995 | Diekema et al. | 364/483 |
| 5,483,153 A | 1/1996 | Leeb et al. | 324/76.12 |
| 5,525,898 A | 6/1996 | Lee, Jr. et al. | 324/142 |
| 5,530,738 A | 6/1996 | McEachern | 379/88 |
| 5,587,917 A | 12/1996 | Elms | 364/487 |
| 5,644,271 A | 7/1997 | Mollov et al. | 331/176 |
| 5,706,204 A | 1/1998 | Cox et al. | 364/487 |

\* cited by examiner

*Primary Examiner*—Bryan Bui
(74) *Attorney, Agent, or Firm*—Woodard, Emhardt, Naughton, Moriarty & McNett

(57) ABSTRACT

A uniquely configured electrical power transmission data recorder system generates a first data stream. The first data stream is a digitized form of an electric power signal being monitored. The data recorder calculates a second data stream from the first data stream. The second data stream is a phasor representation of the electrical power signal being monitored. Vectors of the second data stream are provided at a lower frequency than vectors of the first data stream. The data recorder system associates different fault triggers with each of the data streams. When the data recorder detects a condition that activates one or more of the fault triggers, it generates a power fault record. The power fault record has a prefault portion corresponding to a time period before a fault is detected and a postfault portion corresponding to a time period after the fault ceases. The system may include a number of different processors dedicated to different power monitoring and data recording tasks.

30 Claims, 8 Drawing Sheets

POWER MONITORING SYSTEM AND METHOD

CROSS-REFERENCE TO RELATED APPLICATIONS

This application claims the benefit of U.S. Provisional Application No. 60/080,054, filed on Mar. 31, 1998.

BACKGROUND OF THE INVENTION

The present invention relates to electrical monitoring systems and methods, and more particularly, but not exclusively, relates to a technique for monitoring electrical power transmission, detecting power transmission anomalies, and selectively collecting data to further analyze such anomalies.

The efficient and reliable distribution of electric power often depends on effective monitoring of the power signals and related equipment to detect anomalous conditions. When an anomalous condition is detected, corresponding data is usually collected for analysis. In many instances, this data is gathered at a number of remote locations for subsequent transmission to a central location for analysis.

One approach has been to store a high resolution digitized waveform of the power signals for a predetermined period of time in response to detection of an anomalous condition. Unfortunately, data storage resources and data transmission rates limit the amount of data that may be collected in this manner. Moreover, the desire to capture data for a rapid succession of anomalous conditions also limits the amount of storage that may be allocated to a given data collection event. Commonly owned U.S. Pat. No. 5,216,621 to Dickens is cited as a source of additional information concerning one waveform storage approach and is hereby incorporated by reference.

In view of the limitations of waveform storage, an alternate approach has been to perform various calculations in real-time and store or transmit the calculation results in place of the waveform data. While storage of results may conserve memory compared to storage of digitized waveform, it also tends to sacrifice information relevant to certain types of anomalies. In still other situations, equipment has been tailored to digitally record a sequence of discrete, power-related events without direct analog signal measurement.

These approaches each fail to offer the type of comprehensive system needed to advance power monitoring performance. Moreover, a system is needed which may be readily reconfigured in response to changing power monitoring needs and still make maximum use of available processing and memory resources. The present invention satisfies these needs and provides other important benefits and advantages.

SUMMARY OF THE INVENTION

One form of the present invention is a unique electrical power monitoring system. Another form is a unique method of monitoring one or more electrical parameters.

Other forms of the present invention include techniques to monitor electrical power by generating multiple data streams representative of the same electrical power signal. The multiple data streams uniquely correspond to one or more different performance characteristics and may be supplied at different rates to improve monitoring efficiency.

In still another form of the present invention, an electrical waveform corresponding to an electrical power transmission is sampled to generate a first data stream of waveform samples at a first rate. A second data stream is periodically determined from the first data stream at a second rate slower than the first rate. The second data stream is also representative of the waveform. The first and second data streams may be further processed to selectively form records indicative of power anomalies, disturbances, or other events of interest.

In yet another form, the second data stream is calculated from the first data stream and includes a stream of phasors representative of the waveform. For this form, each phasor corresponds to a predetermined number of the waveform samples. Additional values of interest may be derived from the first or second data streams to add to a given record and/or determine when a record should be generated. By way of nonlimiting example, the determination of when to generate a record may include evaluating the first data stream to trigger a first type of power transmission disturbance and the second data stream to trigger a second type of power transmission disturbance. The record may include at least a prefault portion and a postfault portion of each of the first or second data streams.

Accordingly, it is one object of the present invention to provide a unique technique to monitor electrical power.

Alternatively or additionally, it is another object of the present invention to provide a unique system and method for monitoring electrical power and selectively storing corresponding data.

Further objects, advantages, benefits, aspects, features, and forms of the present invention shall become apparent from the description and drawings herein.

DESCRIPTION OF THE PREFERRED EMBODIMENTS

Figure 1:
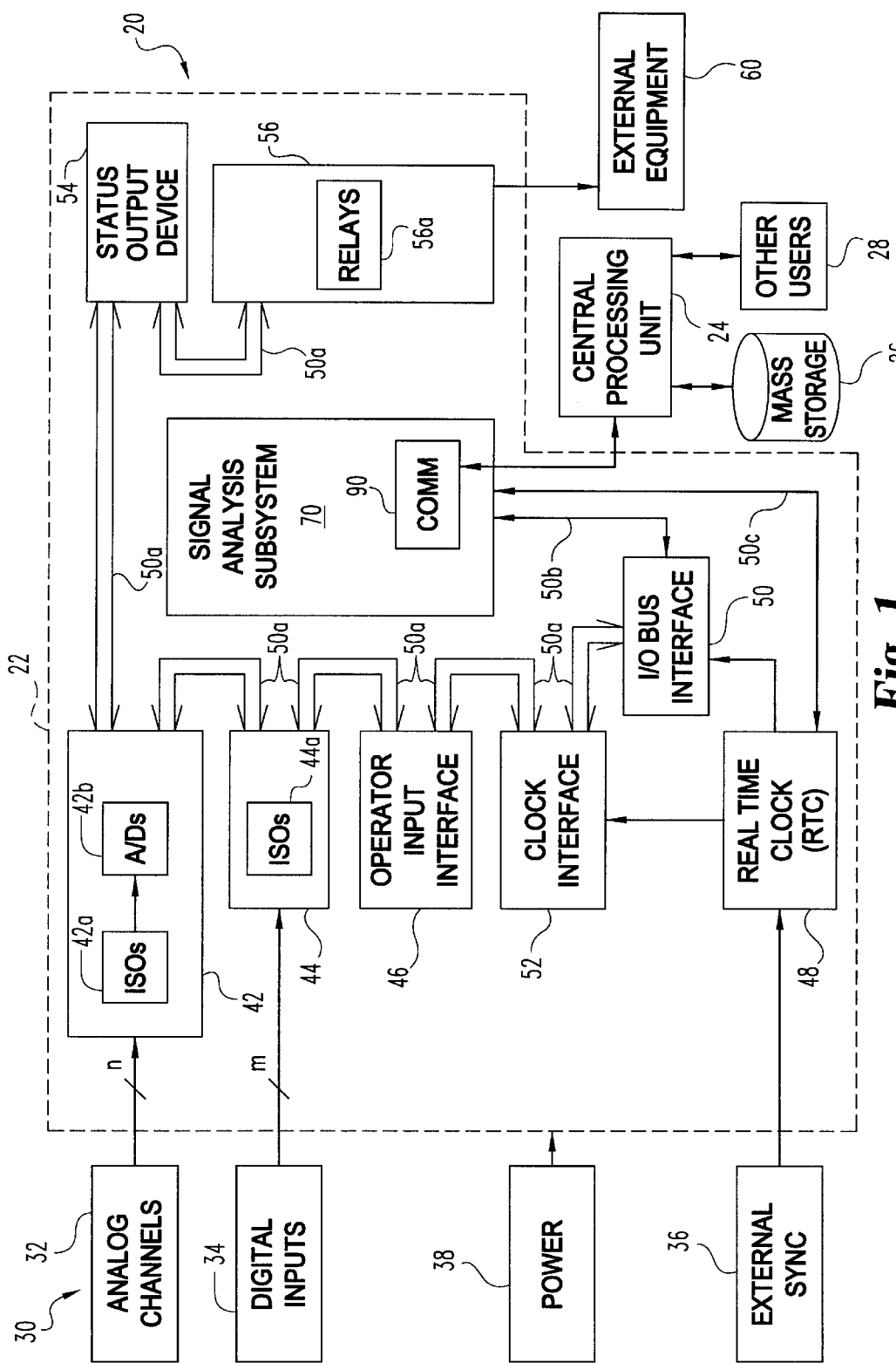
FIG. 1 is a diagrammatic view of an electrical power monitoring system of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

FIG. 1 illustrates electrical power monitoring system 20 of the present invention. System 20 includes data recorder 22 operatively coupled to central processing unit 24. Recorder 22 may be remotely located relative to processing unit 24. Furthermore, processing unit 24 may be coupled to other data recording devices (not shown). Processing unit 24 includes mass storage device 26 preferably of the optical or electromagnetic disk type. It is also preferred that system 20 be of the type suitable for remotely monitoring power and providing relevant data to engineering, operations, planning, and customer service organizations within a power company as represented by reference numeral 28.

Recorder 22 is operatively coupled to a number of external inputs 30. Inputs 30 include "n" analog channel inputs 32, "m" discrete inputs 34, time synchronization input 36, and input power 38. Preferably, at least eight (n=8) analog channel inputs 32 are included when monitoring a common Alternating Current (A.C.) three-phase power distribution network. This embodiment makes available a separate channel to measure current and a separate channel to measure voltage for each phase and neutral of a given electrical power transmission line. More preferably, n is at least 16 to separately measure current and voltage of two A.C. three-phase electrical power transmission lines. Besides these A.C. analog inputs, channel inputs 32 may also include Direct Current (D.C.) analog inputs. In one embodiment, such D.C. inputs are operatively coupled to various transducers and shunts associated with the power distribution network.

The "m" discrete inputs 34 correspond to various digital event signals representative of the status of various power management equipment such as circuit breakers and switches to name a few. Preferably, m is at least 16. Input 36 provides an external synchronization signal (EXTSYNC) representative of a widely available time base that may be used to synchronize recorder 22 to remotely located equipment. This type of synchronization facilitates comparison of electrical power anomalies relative to a common time frame. Such comparisons are desirable in a variety of power analysis situations including: (1) locating a fault along an electrical power transmission line, (2) determining the order of certain events with high accuracy, and (3) efficiently distributing power to name a few. Input 36 may be received from a Global Positioning Satellite (GPS) system source, an IRIG-B source, or such other sources as would occur to those skilled in the art.

Input 38 supplies electrical power to recorder 22. Preferably, the primary source of electrical power for recorder 22 is of the D.C. variety, such as a power substation battery, but may alternatively or additionally include an A.C. power source. Recorder 22 includes circuitry suitable (not shown) to supply and regulate internal electrical power for the given source type.

Recorder 22 includes analog channel interface 42. Interface 42 includes isolators (ISOs) 42a each operatively coupled to a corresponding analog channel 32 to provide galvanic isolation from the power distribution network or other source being monitored. Isolators 42a may include Current Transformers (CTs) to isolate current measurements of an analog channel 32 or Potential Transformers (PTs) to isolate voltage measurements of an analog channel 32 as appropriate. Alternatively, isolators 42a may be based on optical isolation techniques, or such other techniques as would occur to those skilled in the art.

After isolation, each of the "n" isolated analog signals is digitized by a corresponding Analog-to-Digital (A/D) converter 42b of interface 42. The A/D converters 42b may be of a conventional type that sample the corresponding analog signal at a uniform rate to provide a digitized analog waveform for each channel, represented as signals WF(1) through WF(n). A/D converters 42b are synchronized to each other and a common time base. In one preferred embodiment, the sampling rate is 5760 samples per second and the resolution of each digital sample is 16 bits; however, in other embodiments different rates and resolutions are envisioned. Appropriate filters, and other conditioning circuitry is included for each of the A/D converters 42b. In an alternative embodiment, the number of A/D converters 42b may be reduced by multiplexing two or more of the isolated analog signals into a common A/D converter 42b.

Recorder 22 also includes discrete input interface 44. Interface 44 conditions discrete inputs 34 and includes isolators (ISOs) 44a to provide galvanic isolation. Interface 44 also facilitates synchronization of discrete inputs 34 to the same time base as utilized for interface 42 and provides a digital event signal for each of the "m" discrete inputs 34, respectively designated signals DE(1) through DE(m). Preferably, isolators 44a are of the optical variety; however, any isolation technique that would occur to those skilled in the art may be utilized.

Recorder 22 has operator input interface 46. Interface 46 preferably includes a number of switches, such as the push button type, that may be manipulated by an operator to control various operational aspects of recorder 22. For example, one or more of the push buttons may be operated to externally trigger storage of a data record. In other embodiments, interface 46 may include a keyboard or other type of input device suitable to provide operator control of selected aspects of recorder 22. In yet another embodiment, recorder 22 may not include interface 46.

Real Time Clock (RTC) 48 is also included in recorder 22 to provide a stable, temperature-insensitive real-time reference for recorder 22. RTC 48 synchronizes various recorder operations and signals, and provides a highly accurate source for year, month, day, and time-of-day information. Furthermore, RTC 48 is operatively coupled to input 36 to receive EXTSYNC for synchronization to an external time base. To maintain a high degree of stability despite temperature variation, RTC 48 may be made and operated in accordance with the teachings of commonly owned U.S. Pat. No. 5,644,271 to Mallov et al. that is hereby incorporated by reference. RTC 48 provides appropriate synchronization signals to Input/Output Synchronized Serial Bus Interface (IOSSI) 50. IOSSI 50 maintains a synchronized digital serial communication bus 50a linking various input and output devices of recorder 22. Clock interface 52 is also linked to bus 50a and receives time/status information from RTC 48.

Bus 50a is also operatively coupled to status output device 54. Preferably, device 54 includes Light Emitting Diodes (LEDS) that provide selected status information concerning recorder 22 to an operator. Alternatively, other types of indicators, displays, audible alarms, or operator-sensed outputs may be utilized. Still other embodiments provide no direct operator output.

Discrete output control interface 56 is also operatively coupled to bus 50a. Interface 56 includes a number of relays 56a to control external equipment 60. Relays 56a may be of the electromechanical or solid state type compatible with equipment 60. Alternatively or additionally, interface 56 may include other types of devices responsive to discrete signal control. Equipment 60 may include any compatible instruments, controls, indicators, alarms, protection devices, or such other equipment as would occur to one skilled in the art.

Bus 50a is operatively coupled to signal analysis subsystem 70 by serial communication link 50b. Subsystem 70 selectively receives input data signals WF(1)–WF(n) and DE(1)–DE(m) for further processing and analysis. Furthermore, subsystem 70 generates output signals in response that are placed on bus 50a through IOSSI 50 to device 54 and discrete output control interface 56. Bus 50a may also accommodate one or more analog output devices (not shown) having suitable Digital-to-Analog (D/A) conversion capability. In addition, input or output equipment connected to bus 50a may be configured and calibrated by appropriate communications through IOSSI 50. For example, scaling of A/D converters may be controlled through such communications.

Furthermore, it should be appreciated that an alternate type of bus, such as a parallel bus, may be utilized in place of bus 50a. Also, different bus types may be combined and more than one bus interface utilized by recorder 22 using techniques known to those skilled in the art.

Subsystem 70 includes communication devices 90 to output data records generated by recorder 22 to central processing unit 24. Devices 90 may also be utilized to receive remote control information that is passed by subsystem 70 to one or more output devices on bus 50a via IOSSI 50. For example, a master control station remotely located relative to recorder 22 may direct operation of equipment 60 by providing an appropriate equipment control command to subsystem 70. This control command may be provided through a direct connection to one of communication devices 90 or indirectly through central processing unit 24 as one of users 28. Subsystem 70 passes the control command through IOSSI 50 to one or more of corresponding relays 56a to appropriately activate equipment 60.

In one preferred embodiment, interfaces 42, 44, 46, 56 may be of modular design to permit different numbers of each type of input or output to be interfaced to bus 50a. For this embodiment, four analog channel inputs 32 are provided on each module. One or more modules comprise interface 42 to provide a total number of analog channel inputs that is a multiple of four. The maximum number of analog channels that may be accommodated in this manner varies with several factors including the bandwidth of bus 50a, the throughput of recorder 22, and the sampling rate of A/D converters 42b to name a few. When a A/D converter 42b resolution of 16 bits is utilized at a rate of 5760 and bus 50a operates at a 5 MegaHertz (MHz) clock speed, it has been found that as many as 16 analog channels may be accommodated (four modules).

Module designs dedicated to D.C. analog channels may also be utilized in this embodiment. Likewise, for this embodiment, interfaces 44 and 56 are preferably provided as one or more modules each having a predetermined number of discrete inputs and outputs, respectively, to enhance flexibility and simplify reconfiguration of recorder 22.

Figure 2:
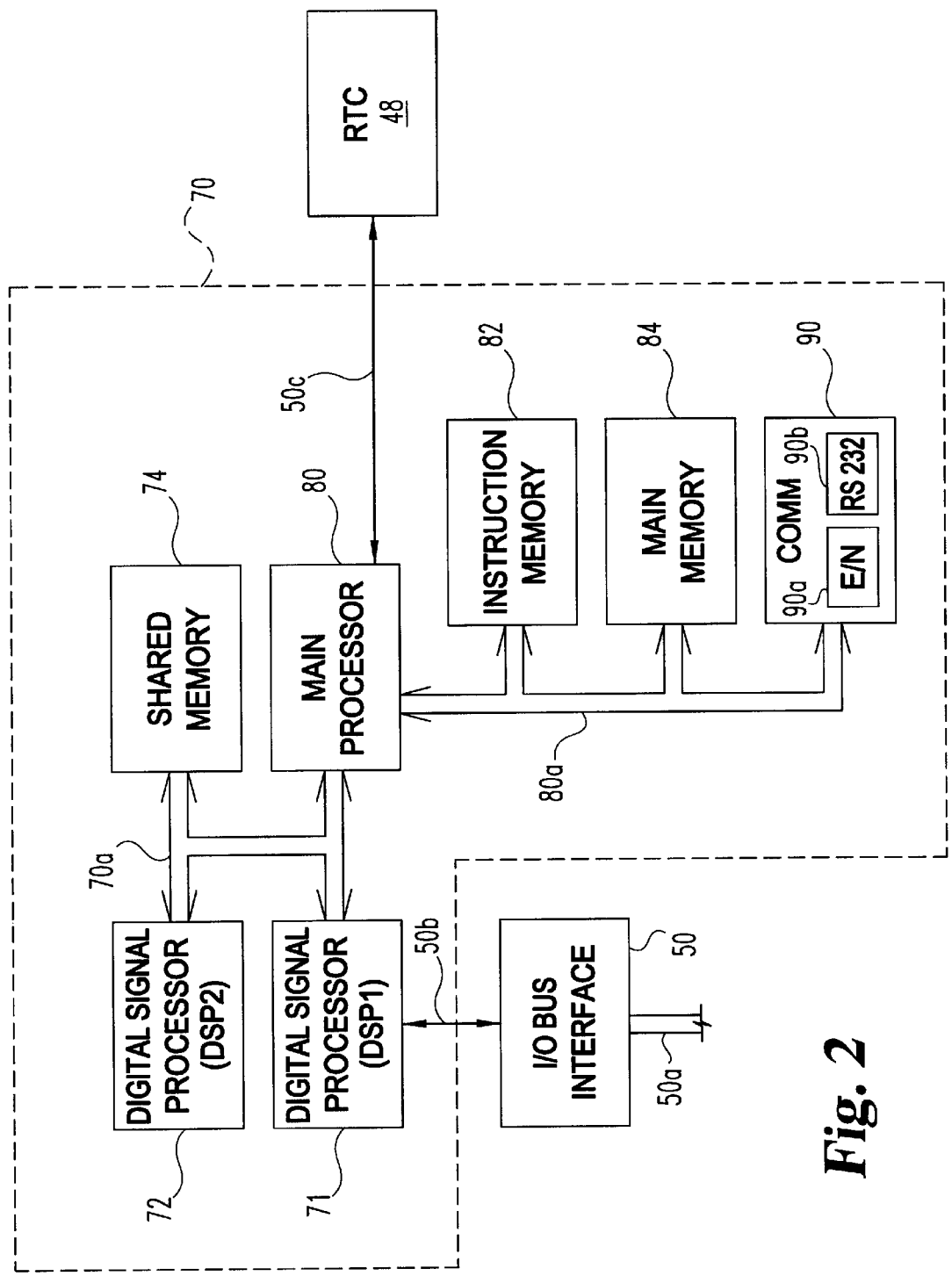
FIG. 2 is a diagrammatic view of selected aspects of the data recorder of the system of FIG. 1.

Referring additionally to FIG. 2, further details concerning subsystem 70 are illustrated. Subsystem 70 includes a first digital signal processor 71 (DSP1) operatively coupled to IOSSI 50 by link 50b. Shared memory bus 70a operatively couples processor 71 to a second digital signal processor 72 (DSP2), shared memory 74, and main processor 80. Preferably bus 70a is of a parallel digital type. Main processor 80 is also operatively coupled to main data bus 80a which is preferably of the parallel type. Bus 80a interconnects instruction memory 82, main memory 84, and communication devices 90 to main processor 80. In addition, main processor 80 is operatively coupled to RTC 48 by signal pathway 50c to set time, sample rate, and read time. In one embodiment, main processor 80 also reads a temperature setting made available by RTC 48.

Processors 71 and 72 are preferably reprogrammable devices particularly suited to processing digitally represented signals. It is also preferred that processors 71 and 72 include on-board memory that may be accessed to load programming instructions as required. In one embodiment, processor 71 is a Texas Instruments signal processor designated by model number TMS320C53 and processor 72 is a Texas Instruments programmable digital signal processor designated by model number TMS320C26. In other embodiments, different signal processing components and configurations may be utilized suitable to provide the operations of the present invention. Furthermore, other devices may be interfaced with shared memory bus 70a, including, for example, dedicated combinational or sequential logic to meet various specialized processing needs.

Shared memory 74 is preferably of the electronic type provided by one or more components. In one embodiment, memory 74 is of the Static Random Access Memory (SRAM) variety with 32 k×16 bit organization. However, in other embodiments, a different variety, quantity, or organization of memory 74 may be utilized that is suitable for interfacing with processors 71, 72, and 80.

Main Processor 80 is preferably a general purpose digital processor suitable to control subsystem 70. In one preferred embodiment, processor 80 is a model number 80386EX embedded microprocessor manufactured by Intel Corporation with an operating clock speed of 25 MHz; however, in other embodiments, different processors may be utilized as would occur to one skilled in the art.

Preferably, instruction memory 82 is of the nonvolatile flash type to maintain executable instructions for processors 71, 72, and 80 when recorder 22 is not powered. The amount of instruction memory 82 is preferably sized to hold the operating programs for each processor 71, 72, and 80, as well as selected data constants. In one embodiment, memory 82 also includes space to store internal diagnostic information.

Main memory 84 is preferably of the Dynamic Random Access Memory (DRAM) type to maintain data supplied by processors 71 and 72 through shared memory 74. Memory 84 is sized to provide ample storage of data records reflecting anomalous performance during monitoring. In one preferred embodiment, memory 84 is at least 2 Megabytes (Mbyte). In a more preferred embodiment, memory 84 is at least 16 Mbyte.

Data is output from main memory 84 to mass storage 26 of central processing unit 24 through one or more communication devices 90. Preferably, Ethernet (E/N) port 90a of devices 90 is utilized for this purpose to transfer data records from memory 84 at a rate sufficient to prevent exhausting all available memory space in a memory 84 under expected operating conditions of system 20. In one embodiment, port 90a operates at a 10 (Megabit) Mbit rate. Communication devices 90 also include a conventional RS232 port 90b to facilitate various data exchanges. In other embodiments, other types of communication ports or interfaces may be additionally or alternatively utilized by subsystem 70.

The processors and memories of subsystem 70 are preferably each provided by one or more digital electronic components that may be readily interfaced to each other. In alternative embodiments, memories 74, 82, and 84 may be of any type that would occur to one skilled in the art including optical, magnetic or electronic varieties. Moreover, the processors and memories may be combined or rearranged as would occur to one skilled in the art. By way of nonlimiting example, processors 71,72, and shared memory 74 may be combined on one integrated circuit chip suitable for interfacing with main processor 80. In another example, a single processor may be employed in place of processors 71, 72, and 80. In still another example, processors 71, 72, 80 and memories 74, 82, 84 are all provided as a single dedicated integrated circuit chip.

Figure 3:
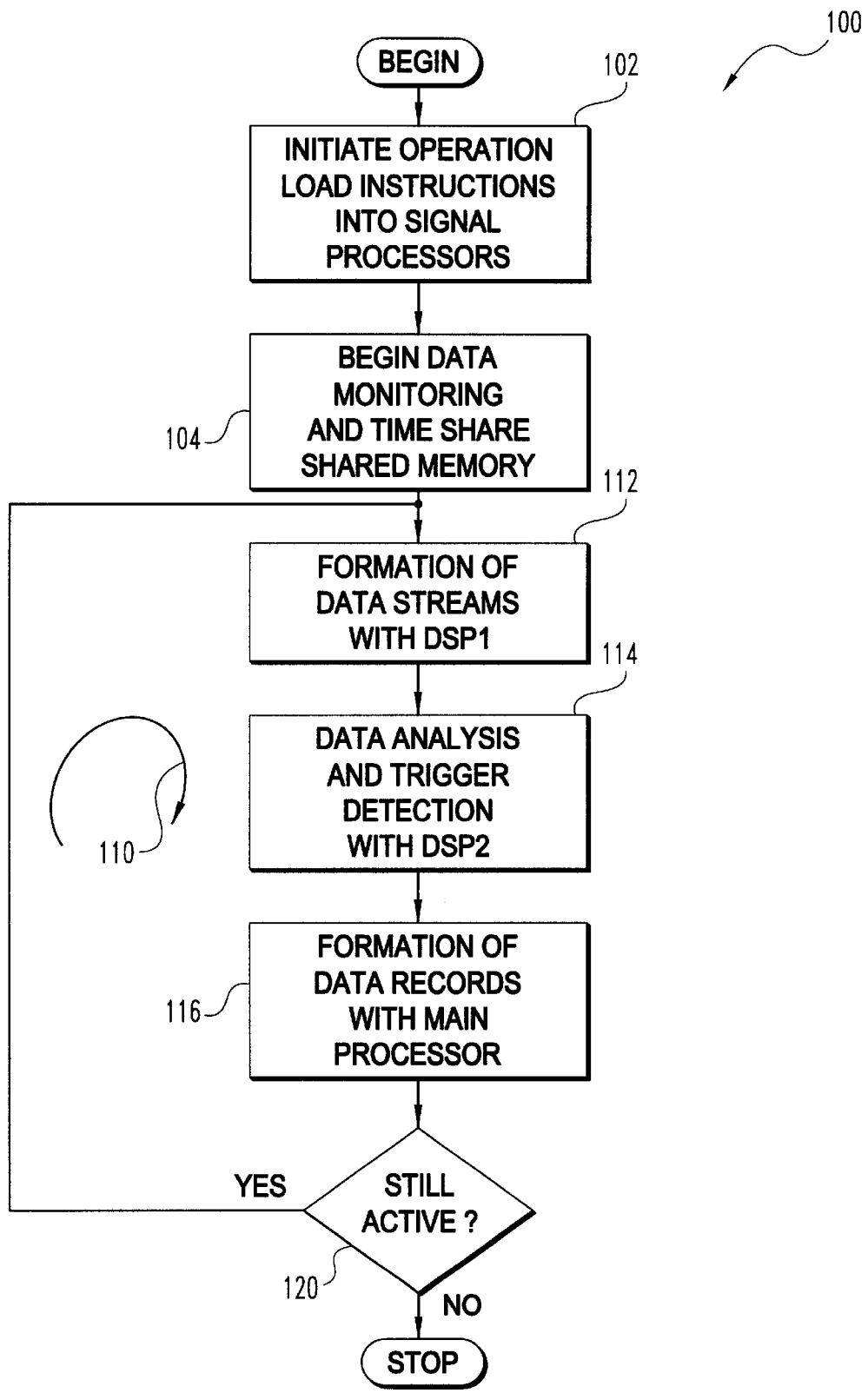
FIG. 3 is a flow chart of the data monitoring and recording process performed with the system of FIG. 1.

FIG. 3 depicts a flow chart of one mode of operation of system 20 as data monitoring and recording process 100. Referring also to FIGS. 1 and 2, system 20 is arranged to continuously monitor data signals WF(l)–WF(n) and DE(1) –DE(m) representative of external inputs 30 in real-time. Subsystem 70 analyzes this data to detect certain predetermined conditions that trigger storage of a data record in main memory 84 for subsequent transmission to central processing unit 24 and/or generation of one or more output signals for device 54 or interface 56. Process 100 details selected operations of subsystem 70 in this regard.

In operation 102 of process 100, recorder 22 is initialized, which causes processor 80 to initially load its programming from memory 82. After main processor 80 is initialized, processor 80 loads instructions for each processor 71, 72 into shared memory 74. In turn, processors 71, 72 access shared memory 74 to load respective programming. Once initialized, processor 71 begins loading of external inputs 30 (analog input channels 32 and digital inputs 34), interface 46 and RTC 48 status and time. Correspondingly, recorder status is output to device 54 and interface 56 is initialized. Also, a self-test is executed by main processor 80 to determine the working order of recorder 22.

Operation 104 also initiates a "round robin" time sharing of memory 74 under control of main processor 80. This time sharing sequentially cycles access to memory 74 to each processor 71, 72, and 80 as part of the data monitoring loop 110 beginning with operation 112. The access time for each processor 71, 72, 80 is preferably less than the interval of time between each valid waveform sample within processor 71 (DSP1) to maintain orderly real-time processing of signal data. It should be understood that the sampling rate of A/D converters 42b may be different than the sample frequency used within processor 71. For example, in one instance, A/D converters 42b oversample the analog signals at 11,520 samples/second to accommodate desired filtering techniques, and processor 71 decimates these samples by a factor of 2 to provide an internal sampling rate of 5760 samples/second.

The sequential access to shared memory 74 during execution of loop 110 is utilized to allocate data processing among processors 71, 72, and 80. Generally, input and output data is first processed by processor 71 (DSP1) and stored in memory 74 for subsequent access by processor 72 (DSP2). Processor 72 further analyzes the data from processor 71 and stores the results in memory 74 for subsequent access by main processor 80. Main processor 80 loads the data in memory 74 from processor 72 and organizes the data for possible retention as data record in main memory 84. Also, during each access, processors 71, 72, and 80 each load one or more control words from one or more of the other processors to exchange control information. For example, processor 72 may direct the operation of one or more of relays 56a by storing a control word with a corresponding command in shared memory 74 during its access period. Processor 71 subsequently reads the control word during its access period and passes the command through IOSSI 50 to interface 56.

Having briefly outlined loop 110, further details specific to operations 112, 114, and 116 of loop 110 are next described. Operation 112 corresponds to activities performed by processor 71. In operation 112, processor 71 (DSP1) forms a number of real time data streams for each analog channel. When processor 71 has access to memory 74, it buffers successive segments of these data streams in memory 74 for subsequent analysis and processing by processors 72 and 80 during respective shared memory 74 access periods.

Figure 4:
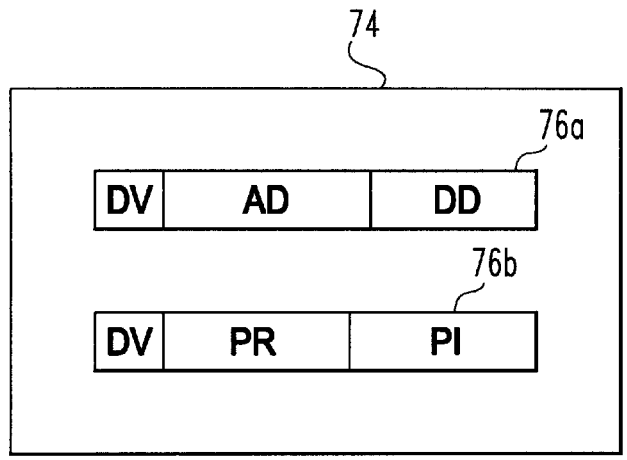
FIG. 4 is a memory space diagram of a shared memory of the recorder of FIG. 2 depicting vectors of respective data streams.

Referring additionally to FIG. 4, vectors of two data streams for a given analog channel are shown stored in shared memory 74. Data stream vector 76a corresponds to a first data stream that is buffered in memory 74 at the highest sample rate available within processor 71. Vector 76a includes analog waveform sample data represented by data segment AD and discrete data represented by data segment DD. Segment AD may correspond to current, voltage, or another parameter of interest for the given analog channel as would occur to those skilled in the art. Segment DD includes digital inputs 34, operator input through interface 46, the status of outputs associated with device 54 and interface 56, and time from interface 52. Vector 76a includes data valid bit DV that is used by processor 72 (DSP2) when it has access to memory 74. Data stream vector 76b corresponds to a second data stream that has been derived from the first data stream in real-time by processor 71. The second data stream includes data valid bit DV and also includes a phasor representation of the corresponding analog input channel. The phasor data is buffered with a real data part PR and an imaginary data part PI. Consequently, the vectors 76a, 76b correspond to a sample data stream (the first data stream) and a phasor data stream (the second data stream). The phasor data stream is decimated relative to the sample rate utilizing an appropriate decimation filtering technique. For one preferred embodiment, this decimation process buffers a phasor data vector 76b in memory 74 for every eight (8) sample data vectors 76a. In other embodiments, different data stream compositions and relative buffering rates may be utilized as would occur to one skilled in the art.

Returning to FIG. 3, operation 114 is next encountered. Operation 114 corresponds to the processing operations of processor 72 (DSP2). The programming of processor 72 is directed to deriving various values from the data streams generated by processor 71 (DSP1). Also, processor 72 determines if the data from processor 71 or main processor 80 satisfy one or more predetermined trigger conditions prompting creation of a data record.

Figure 5:
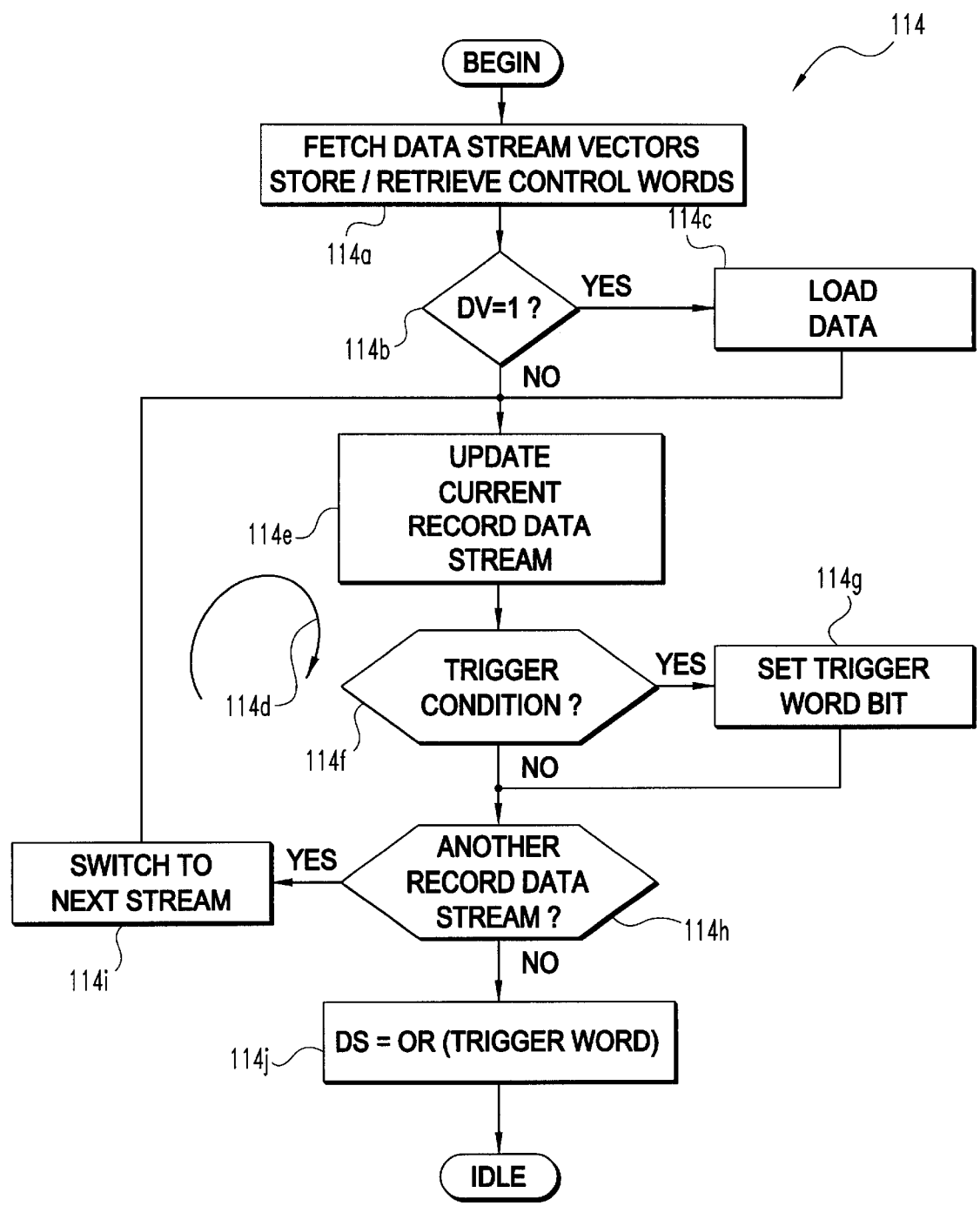
FIG. 5 is a flow chart depicting selected aspects of a data analysis operation of the process of FIG. 3.

Referring also to the flow chart of FIG. 5, operation 114 is further described. Operation 114 corresponds to the activity of processor 72 (DSP2) that is preferably repeated with each new access to shared memory 74. In stage 114a, processor 72 utilizes its shared memory 74 access periods to fetch the data stream vectors stored in memory 74 by processor 71 and data stored by main processor 80 during its last access. Processor 72 also stores control words in memory 74 for subsequent access by processors 71 and 80 as appropriate. Conditional 114b tests whether the data valid bit DV for a data stream vector is set (DV=1). If DV=1, then processor 72 utilizes this vector to update its signal processing as reflected by load data stage 114c. The data valid bit (DV) for each data stream is similarly processed. Operation 114 then enters analysis loop 114d. If DV is not set (DV=0), then processor proceeds directly to loop 114d. For an embodiment in which processor 72 gains access at the sample rate and for which the phasor data stream is decimated by a factor of eight, processor 72 would typically load a new sample data vector 76a every access, but a new phasor vector 76b would only be loaded by processor 72 every eighth access.

Figure 6:
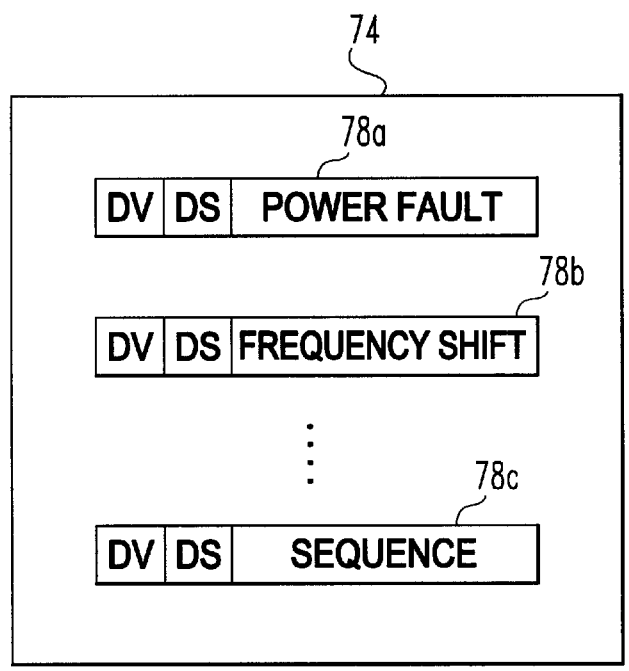
FIG. 6 is a memory space diagram of the shared memory of FIG. 2 depicting record data stream vectors determined from the vectors of FIG. 4.

Loop 114d begins with the stage 114e in which processor 72 updates a record data stream with any data loaded during stage 114c. Processor 72 is preferably programmed to generate a number of different record data streams pertinent to power monitoring. These record data streams are generated relative to the time base used to establish the data streams from processor 71 and are stored in shared memory 74 as illustrated in FIG. 6.

The record data streams provided by processor 72 may include at least a portion of one of the processor 71 data streams and further may include one or more calculated values determined by processor 72 from one or more of the data streams provided by processor 71. The information included in a record data stream may be dedicated to a particular monitoring task. Referring to FIG. 6, three non-limiting examples of record data stream vectors designated by reference numerals 78a, 78b, and 78c are depicted that correspond to: (1) a power fault (PF) record data stream (vector 78a), (2) a frequency shift (FS) record data stream (vector 78b), and (3) a sequence of events (SER) record data stream (vector 78c), respectively. Each of the vectors 78a, 78b, 78c includes a data valid bit (DV) as described in connection with FIG. 4, and a data save bit (DS) as more fully described in connection with stage 114j of FIG. 5 hereinafter.

Because power faults may happen quickly, the power fault record data stream comprised of vectors 78a, typically includes the highest available rate of waveform and digital status data. Also, processor 72 preferably calculates A.C. channel frequency; Total Harmonic Distortion (THD); and zero, positive and negative sequence values for inclusion in the power fault record data stream. On the other hand, frequency shifts typically happen more slowly, which favors inclusion of the phasor data stream in a frequency shift record data stream. Calculated values added to the frequency shift data stream by processor 72 preferably include frequency, change in frequency over a predetermined period; and phasor-based zero, positive, and negative sequence values. Other calculated values that may be provided by processor 72 include analog waveform amplitude, change in voltage or current, power, power factor, or impedance to name a few. The particular values calculated may be selected through the programming of processor 72 to generate other record data streams as would occur to one skilled in the art.

Besides calculating and associating values with one or more of the processor 71 data streams to form record data streams, processor 72 also calculates values needed to determine if a particular trigger condition has occurred. For example, programming of processor 72 may associate one or more trigger conditions with a given record data stream, such as an undervoltage, overvoltage, rate of frequency change, power factor limit, or distortion level to name a few. The particular threshold values for such conditions may be included in the processor 72 programming.

Returning to FIG. 5, conditional 114f of operation 114 tests whether one or more triggers occurred in connection with the record data stream currently being processed. If the trigger condition has occurred, control flows to stage 114g to set a corresponding bit in a trigger data word. It should be appreciated that a given record data stream may include a number of trigger conditions that each have a corresponding bit in the trigger data word. Operation 114 then proceeds to conditional 114h. If no trigger has occurred, then control flows directly to conditional 114h.

Conditional 114h determines if another record data stream needs to be processed. If another record data stream requires service, processor 72 operation continues in stage 114i by switching to service the next record data stream, updating with any newly loaded data via stage 114c as required. Stage 114i then returns to stage 114e, closing loop 114d. If other record data streams do not require servicing, then operation 114 advances to stage 114j to set the data save bit (DS) if any of the trigger word bits are set, such as may be performed by a boolean "OR" operation on the trigger word bits. This operation is symbolized by the "OR(TRIGGER WORD)" function in FIG. 5. Furthermore, processor 72 may alter the data valid bit (DV) associated with record data stream values to control the storage frequency of certain values as more fully described in connection with FIGS. 7 and 8. Once stage 114j is complete, processor 72 idles until the next access period to shared memory 74. However, operation 114 may not consistently finish processing each access period, in which case processor 72 is programmed to suspend various tasks when making use of its access period or to alternatively relinquish one or more access periods.

Figure 7:
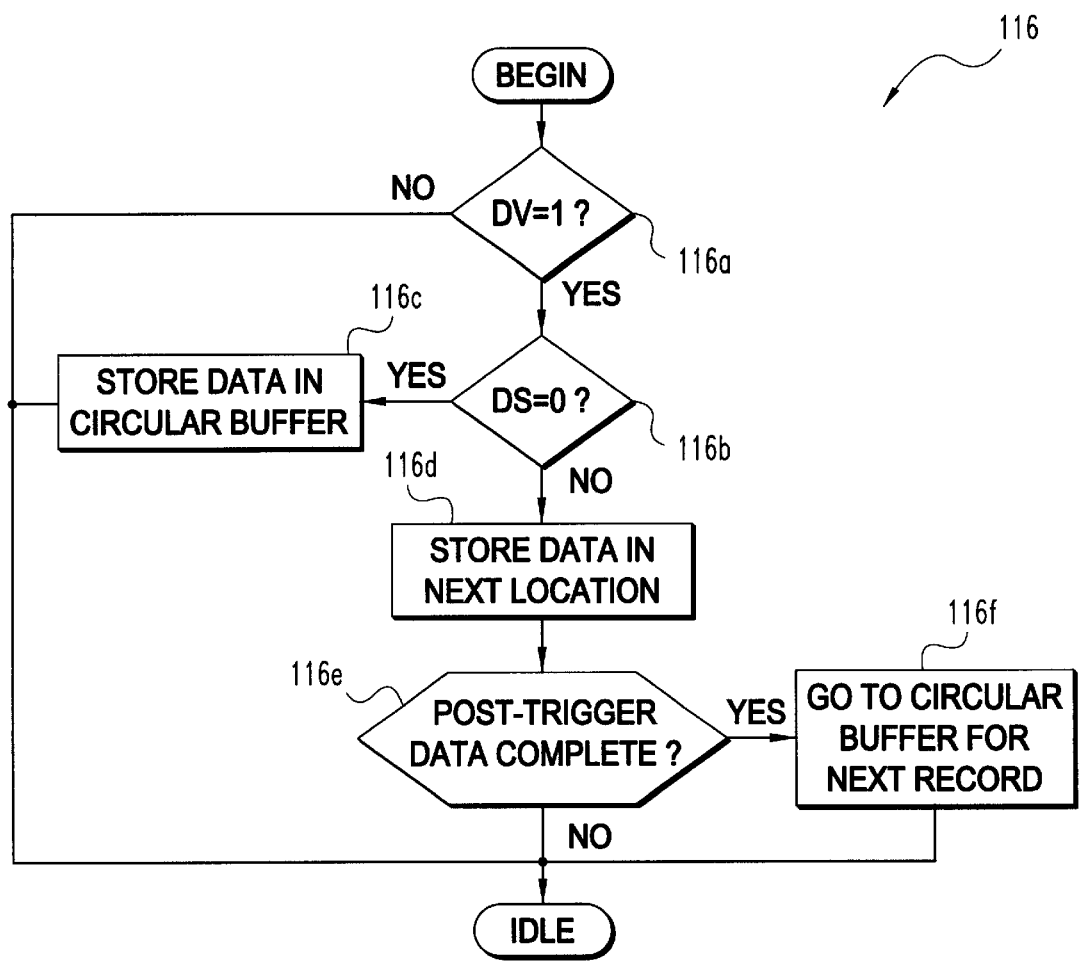
FIG. 7 is a flow chart depicting selected aspects of a record formation operation of the process of FIG. 3.

Returning to FIG. 3, operation 116 is encountered after operation 114. Operation 116 corresponds to the activity of processor 80 in response to each access period for shared memory 74. Main processor 80 manages record formation and creation from the record data streams generated by processor 72. Referring to FIG. 7, further aspects of operation 116 in forming certain types of records are illustrated. During each access to memory 74, main processor 80 fetches the new record data stream vector for each data stream and evaluates the control bits DV and DS. In conditional 116a, bit DV is tested to determine if data for a corresponding one of the record data streams is valid (DV=1). If the data is not valid (DV=0), it is not saved. If none of the data is valid, operation 116 idles as shown in FIG. 7.

Figure 8:
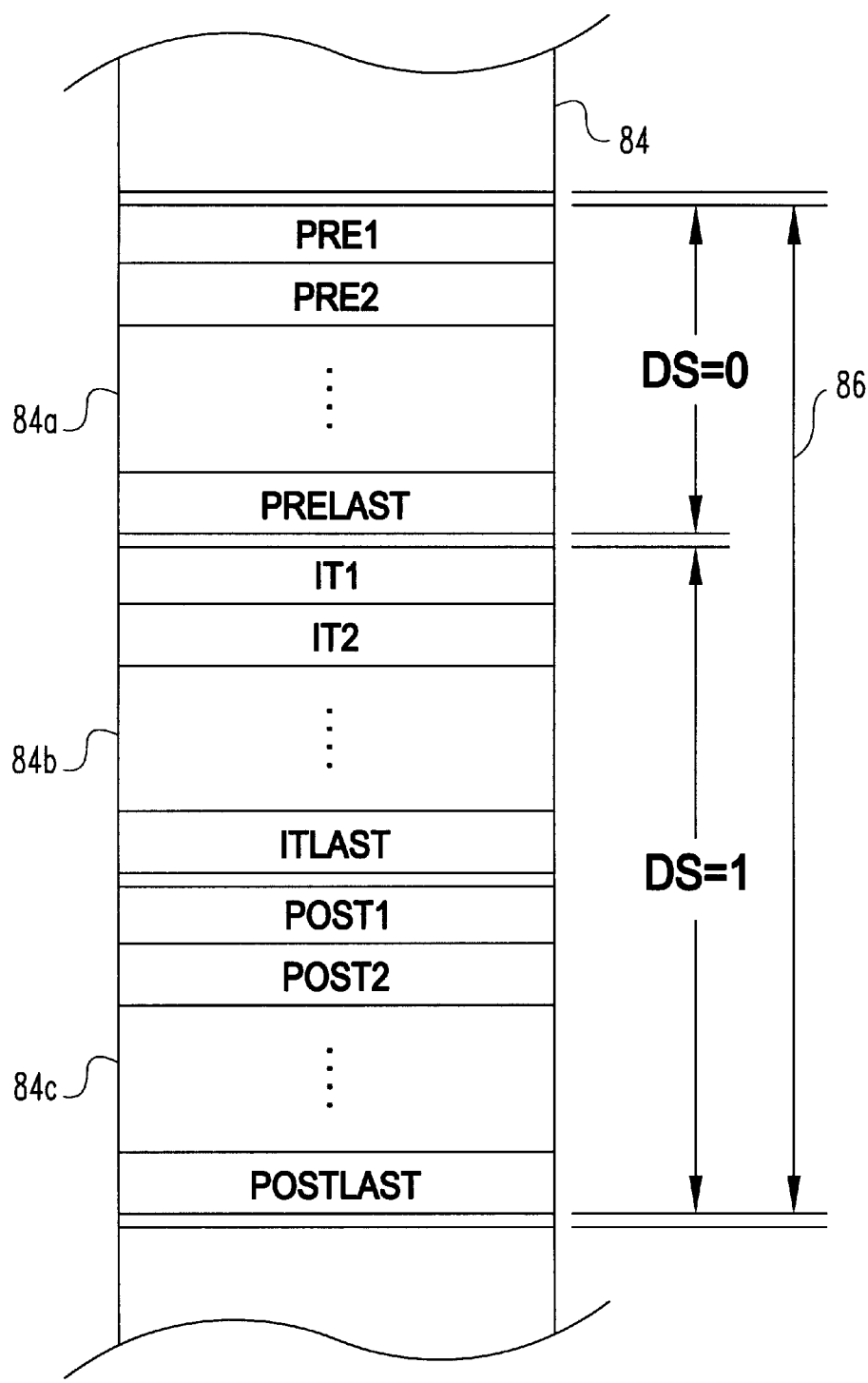
FIG. 8 is a memory space diagram of the main memory of FIG. 2 depicting selected aspects of data record organization.

If data is valid (DV=1) for a corresponding record data stream, then main processor 80 saves the data in buffer 84a of memory 84 until it is full. Buffer 84a is defined by memory locations PRE1, PRE2, . . . , and PRELAST (PRE1–PRELAST) as illustrated in FIG. 8. Once buffer 84a has been initially filled, data is saved in accordance with data save bit DS as represented by conditional 116b. Conditional 116b test whether data save DS is set or not. If DS=0, operation 116 advances to stage 116c to continue storage in buffer 84a in a circular fashion such that the oldest data is discarded to make room for the most recent data. Buffer 84a continues to operate as a circular buffer as long as DS=0.

If the data save bit is set high (DS=1), then control flows to stage 116d. The occurrence of DS=1 corresponds to the detection of a trigger condition by processor 72 and results in creation of a record in main memory 84 as illustrated in FIG. 8. Record 86 begins with the current contents of circular buffer 84a which correspond to a prefault portion of the record data stream (DS=0). In stage 116d of operation 116, storage of the corresponding record data stream continues at the next location after buffer 84a, location IT1 of in-trigger data region 84b. With each new access to shared memory 74 by main processor 80, record data stream data for which DV=1 and DS=1 is consecutively stored in region 84b as long as the trigger condition exists. Locations IT1, IT2, . . . , and ITLAST (IT1–ITLAST) of region 84b are illustrated. Once processor 72 detects the cessation of the trigger condition, storage continues for a predetermined postfault length in postfault region 84c starting with location POST1 after the last location of region 84b (ITLAST) and continuing for locations POST2–POSTLAST. Processor 72 then keeps DS high (DS=1) for an additional, predetermined length corresponding to the prefault record length for the next possible record. If no new trigger condition occurs when initially storing this next prefault length in memory 84, processor 72 will return data save to low (DS=0) and main processor 80 will adjust to process this next prefault length as a circular buffer for the next possible record. On the other hand, if a trigger does occur before storage of data corresponding to the postfault or next prefault length, then record 86 continues until the trigger condition ceases and subsequent postfault and prefault data lengths are consecutively stored without an intervening trigger. Once record 86 is complete, it is preferably transferred via port 90a to central processing unit 24 or otherwise utilized as required by system 20.

Returning to FIG. 7, conditional 116e corresponds to the determination by processor 72 to reset DS low (DS=0) once the postfault and next possible prefault region have been filled. The overall record length and length of various record portions, such as the prefault and postfault lengths, are preferably selectable through programming. Typically, a prefault, in-trigger, and postfault record organization is preferred in response to trigger conditions associated with power faults, frequency shifts, and other types of analog signal anomalies. In contrast, for a sequence of events trigger, it is preferred that a "snapshot" record of the digital event data with desired calculations be provided without prior or subsequent data. Moreover, it should be appreciated that processor 72 may control the rate at which data is added to a buffer or record by setting data valid (DV=1) for a given record data stream at the desire frequency of storage. In other embodiments, a different record formation structure may be utilized as would occur to one skilled in the art.

Besides record formation, main processor 80 also supervises the operation of subsystem 70. This supervision includes allocating memory space for records; controlling communications via ports 90a, 90b; and various other processes such as a background diagnostic routine.

Returning to FIG. 3, conditional 120 is encountered in process 100 after operation 116. Conditional 120 tests whether process 100 is still activated. If process 100 is still active, then control returns to operation 112, closing loop 110. If process 100 is no longer active, then it is discontinued. It should be appreciated that operations 112, 114, and 116 of loop 110 generally occur in parallel, but are synchronized to each other by the sequential access to shared memory 74. This arrangement permits the efficient and flexible processing of real-time power monitoring data without the need for a large memory resource to hold raw data while trigger conditions and other calculations utilizing the data are conducted.

Figure 9:
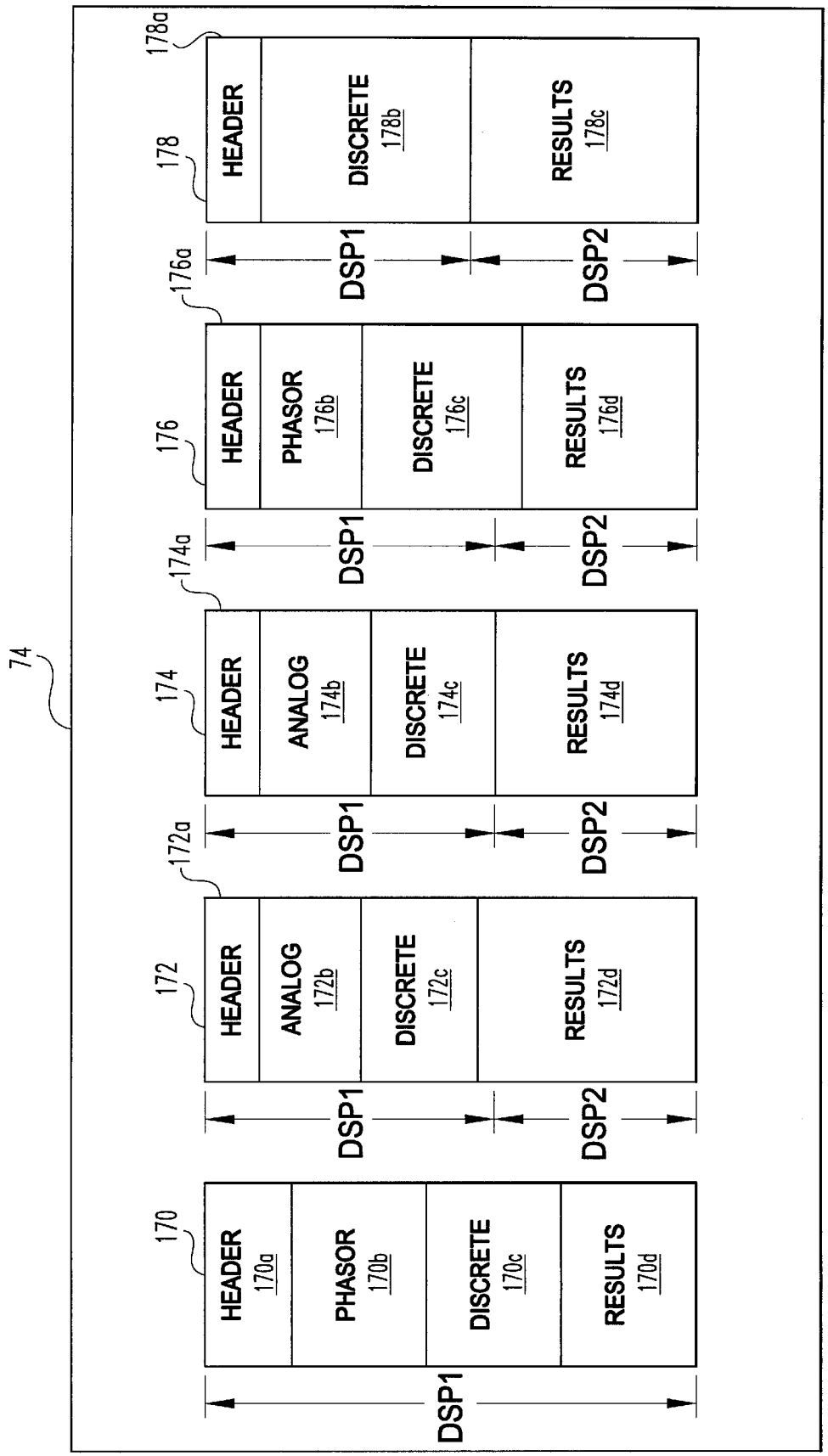
FIG. 9 is a memory space diagram depicting an alternative organization of data streams processed by recorder 22 of the present invention.

FIG. 9 illustrates an alternative embodiment of the data stream organization which may be interchanged with those previously described. To accommodate this interchange, appropriate programming alterations or processors 71, 72, and 80 are made. Also, it is preferred that processor 71 and 72 both be a model number TMS320C50 signal processor provided by Texas Instruments. FIG. 9 depicts shared memory 74 with a number of specialized data vectors. Each vector is a member of a different data stream. Vector 170 corresponds to a phasor data stream that is generated by processor 71, this phasor data stream is preferably generated at a rate less than the waveform sampling rate. In one preferred embodiment, waveform data is generated at 5760 samples/second and vectors 170 are generated at 720 values/ second to provide one vector 170 for every 8 waveform samples.

Vector 170 includes an identifying header 170a. Vector 170 also includes phasor data 170b determined from WF(1)–WF(n) and discrete event data 170c determined from DE(1)–DE(m). Furthermore, processor 71 provides various calculated results 170d. Results 170d include computation of frequency, change in frequency, and THD. Also, processor 71 converts digital event signals DE(1)–DE(m) into normal and abnormal changes of state, smoothes any analog D.C. data, decimates the waveform data as needed, and provides filtering as required.

Unlike the remaining vectors, vector 170 is the only vector utilized by processor 72 to detect trigger conditions and calculate additional values. These results are appended onto the other vectors. The values calculated by processor 72 may include analog signal magnitude, power, impedance, as well as values to detect programmed trigger conditions. Also, the results provided by processor 72 may include control bits, such as data valid (DV) and data save (DS) bits to direct subsequent handling by main processor 80. The header 170a of vector 170 may be used to inform processor 72 when data is valid by including a data valid (DV) flag as previously described.

Vectors 172, 174, 176, and 178 each include elements determined by both processors 71 and 72. Vector 172 corresponds to a high speed, sample rate data stream. Processor 71 provides identifying header 172a, analog waveform data 172b, and discrete status data 172c of vector 172. The results 172d of vector 172 are provided by processor 72 as determined from vector 170.

Vector 174 corresponds to a decimated data stream. In one preferred embodiment, vectors 174 are provided at the same rate as vectors 170. Processor 171 generates vector header 174a, decimated waveform data 174b, and decimated discrete status data 174c. Results 174d are appended to vector 174 by processor 72 as determined from vector 170.

Vector 176 corresponds to a slow phasor-based data stream. In one preferred embodiment, vectors 176 are generated at a rate of one per cycle of the analog A.C. transmission being monitored. For example, the vector 176 rate for this preferred embodiment would be 60 per second for a typical A.C. power transmission frequency of 60 Hertz (Hz). Processor 71 generates identifying header 176a, phasor data 176b, and discrete status data 176c. Processor 72 provides results 176d of vector 176 as determined from vector 170.

Vector 178 corresponds to a sequence of events determined by processor 71. Vector 178 includes identifying header 178a and pertinent digital event data 178b provided by processor 71 and results 178c calculated and provided by processor 72.

Main processor 80 may be utilized to form data records in the manner previously described, with processor 72 providing the appropriate DV and DS control bits in the results of the various vectors. Thus, this alternative data stream organization of FIG. 9 may also be utilized in accordance with process 100 to enhance power monitoring capabilities.

Still another embodiment of the present invention includes digitally sampling an electrical waveform corresponding to an electrical power transmission to generate a first data stream of waveform samples at a first rate. A second data stream is determined from the first data stream. The second data stream has a rate slower than the first rate by a predetermined amount. The second data stream calculation may be performed with a first processor. Also, the second data stream may correspond to a phasor representation of the waveform. The first and second data streams are buffered in a first memory. The first memory is accessed with a second processor to periodically derive a first set of values to add to the first data stream and a second set of values to add to the second data stream. A power disturbance record is generated that includes at least a prefault portion and a postfault portion of one of the first and second data streams after accessing. A data recorder device for monitoring electrical power may be configured to incorporate these techniques.

A further embodiment of the present invention is a data recording system including a data recorder to sense at least three analog waveforms corresponding to a three-phase electrical power transmission and a first means for sampling at least one of the waveforms to generate a first data stream of waveform samples at a first rate. The system also includes a second means for calculating a second data stream from the first data stream that corresponds to a phasor representation of the waveform and has a second rate slower than the first rate. The system further includes a third means for evaluating the first and second data streams to correspondingly include a first set of derived values in the first data stream and a second set of derived values in the second data stream. A fourth means generates a power anomaly record that includes at least a prefault portion and a postfault portion of one of the first and second data streams.

An additional embodiment of the present invention includes a system comprising a data recorder to monitor an electrical power transmission that includes a plurality of analog input channels, a converter to digitize an analog signal from one of the analog input channels, and a signal analysis subsystem. This subsystem is responsive to the converter to provide: (a) a first data stream at a first rate, the first data stream being a digitized form of the analog signal; (b) a second data stream calculated from the first data stream, the second data stream including a phasor representation of the analog signal and being provided at a second rate slower rate than the first rate; and (c) a trigger signal responsive to a predetermined condition of the first data stream or the second data stream representative of an electrical power transmission anomaly. The subsystem is operable to generate a data record in response to the trigger signal. This record includes a prefault data segment corresponding to a time period before the anomaly starts and a postfault data segment corresponding to a time period after the anomaly ceases. These segments each include at least a portion of the first and second data streams.

As used herein, it should be appreciated that: variable, criterion, characteristic, quantity, amount, value, constant, command, flag, data, data point, data stream, vector, record, threshold, limit, input, output, and memory location each generally correspond to one or more signals within processing equipment of the present invention. It is contemplated that various functional blocks, operators, operations, stages, conditionals, procedures, thresholds, and processes described in connection with the present invention could be altered, rearranged, substituted, deleted, duplicated, or combined as would occur to those skilled in the art without departing from the spirit of the present invention.

Commonly owned U.S. Provisional Patent Application Serial No. 60/080,054, filed Mar. 31, 1998, the benefit of which is claimed herein, is hereby incorporated by reference. Also, all publications, patents, and patent applications cited in this specification are herein incorporated by reference as if each individual publication, patent, or patent application were specifically and individually indicated to be incorporated by reference and set forth in its entirety herein. While the invention has been illustrated and described in detail in the drawings and foregoing description, the same is to be considered illustrative and not restrictive in character, it being understood that only the preferred embodiment has been shown and described and that all changes, equivalents, and modifications that come within the spirit of the invention as defined by the following claims are desired to be protected.

What is claimed is:

1. A system, comprising: a data recorder to monitor an electrical power transmission, said data recorder including:

a plurality of analog input channels;

a converter to digitize an analog signal from at least one of said analog input channels;

a signal analysis subsystem responsive to said converter to provide: (a) a first data stream at a first rate, said first data stream being a digitized form of said analog signal; (b) a second data stream calculated from said first data stream, said second data stream including a phasor representation of said analog signal and being provided at a second rate slower rate than said first rate; (c) a trigger signal responsive to a predetermined condition of said first data stream or said second data stream representative of an electrical power transmission anomaly; and wherein said subsystem is operable to generate a data record in response to said trigger signal, said data record including a prefault data segment corresponding to a time period before said anomaly starts and a postfault data segment corresponding to a time period after said anomaly ceases, said prefault data segment and said postfault data segment each including at least a portion of said first data stream and said second data stream.

2. The system of claim 1, wherein said data record further includes an in-trigger segment corresponding to a time period during which said anomaly persists.

3. The system of claim 1, wherein said data recorder includes a real time clock coupled to said subsystem.

4. The system of claim 1, wherein said data recorder further includes a number of discrete inputs, a user input interface, and a discrete output control interface each operatively coupled to said subsystem.

5. The system of claim 1, wherein said subsystem includes a first processor to provide said first data stream, a second processor to calculate said second data stream, and a third processor to provide said data record.

6. The system of claim 5, wherein said first processor and said second processor are operatively coupled to a first memory.

7. The system of claim 6, wherein said subsystem includes a third processor operatively coupled to said first memory.

8. The system of claim 7, wherein said third processor is operatively coupled to a second memory and a communication device.

9. The system of claim 8, further comprising a central processing unit operatively coupled to said communication device to communicate with said third processor, said third processor being operable to transmit said data record to said central processing unit, said central processing unit including a mass storage device to store said data record.

10. A method, comprising:

digitally sampling an electrical waveform corresponding to an electrical power transmission to generate a first data stream of waveform samples at a first rate;

calculating a second data stream from the first data stream with a first processor, the second data stream corresponding to a phasor representation of the waveform, the second data stream being provided at a second rate slower than the first rate by a predetermined amount;

buffering the first and second data streams in a first memory;

accessing the first memory with a second processor to periodically derive a first set of values to add to the first data stream and a second set of values to add to the second data stream; and generating a power disturbance record, the record including at least a prefault portion and a postfault portion of one of the first and second data streams after said accessing.

11. The method of claim 10, further comprising assembling the record in a second memory with a third processor, the third processor being operatively coupled to the first and second memories.

12. The method of claim 11, further comprising detecting a number of trigger conditions separated in time and occurring during said evaluating and storing a record for each of the trigger conditions.

13. The method of claim 10, wherein the first data stream includes discrete event data.

14. The method of claim 10, wherein said evaluating includes calculating at least one of waveform magnitude, power, impedance, or frequency from said first or second data stream.

15. The method of claim 10, wherein the record includes an in-trigger portion corresponding to an active trigger condition determined by the second processor.

16. The method of claim 10, further comprising generating a third data stream at a third rate, the third rate being slower than the second rate by a predetermined amount, and wherein the third data stream includes a phasor representation of the waveform.

17. A method, comprising:

digitally sampling an electrical waveform corresponding to an electrical power transmission to generate a first data stream of waveform samples at a first rate;

calculating a second data stream from the first data stream, the second data stream being representative of the waveform and being provided at a second rate, the second rate being slower than the first rate by a predetermined amount;

evaluating the first data stream to detect a first type of power transmission disturbance and the second data stream to detect a second type of power transmission disturbance; and generating a power disturbance record in response to said evaluating, the record including at least a prefault portion and a postfault portion of each of the first and second data streams.

18. The method of claim 17, further comprising generating a sequence of events data record stream, the record including at least a portion of the sequence of events data record stream.

19. The method of claim 17, wherein the first data stream includes discrete event data.

20. The method of claim 17, wherein said evaluating includes calculating at least one of waveform magnitude, power, impedance, or frequency from the first or second data stream.

21. The method of claim 17, wherein:

said evaluating includes periodically deriving a first set of values from the first data stream and a second set of values from the second data stream; and said generating includes providing at least a portion of one of the first or second sets of values in the record.

22. The method of claim 17, further comprising generating a third data stream at a third rate, the third rate being slower than the second rate, and the third data stream including a phasor representation of the electrical waveform.

23. The method of claim 17, further comprising detecting a number of trigger conditions separated in time during said evaluation and storing a record for each of the trigger conditions in a memory.

24. The method of claim 17, wherein said digitally sampling, said calculating, and said evaluating are performed by a data recorder, the data recorder further including a number of analog input channels, a number of discrete inputs, and a number of discrete outputs, the data recorder being operatively coupled to a central processing unit.

25. The method of claim 24, further comprising transmitting the record from the data recorder to the central processing unit.

26. The method of claim 24, wherein the recorder includes a first processor performing said calculating, a second processor performing said evaluating, a third processor assembling the record, and a shared memory operatively coupled to the first, second, and third processors.

27. A data recording system, comprising:

a data recorder to sense at least three analog waveforms corresponding to a three-phase electrical power transmission;

first means for sampling at least one of the waveforms to generate a first data stream of waveform samples at a first rate;

second means for calculating a second data stream from the first data stream, the second data stream corresponding to a phasor representation of the waveform, the second data stream being provided at a second rate slower than the first rate by a predetermined amount;

third means for evaluating the first and second data streams to correspondingly include a first set of derived values in the first data stream and a second set of derived values in the second data stream; and fourth means for generating a power anomaly record, the record including at least a prefault portion and a postfault portion, the prefault and postfault portions each including at least a portion of one of the first data stream and the second data stream.

28. The system of claim 27, wherein said first means includes an A/D converter for each of said waveforms, said second means includes a first digital signal processor, and said third means includes a second digital signal processor.

29. The system of claim 27, wherein said second means generates a third data stream at a third rate slower than the second rate.

30. The system of claim 27, wherein the first set includes at least one of the magnitude, power, impedance, or frequency determined from the first data stream.

* * * * *